United States Patent
Kurle et al.

[11] Patent Number: 6,106,735
[45] Date of Patent: Aug. 22, 2000

[54] WAFER STACK AND METHOD OF PRODUCING SENSORS

[75] Inventors: Jürgen Kurle, Reutlingen; Kurt Weiblen, Metzingen; Stefan Pinter; Horst Muenzel, both of Reutlingen; Helmut Baumann, Gomaringen; Dietrich Schubert, Reutlingen; Karl Bender, Tuebingen; Markus Lutz, Reutlingen, all of Germany

[73] Assignee: Robert Bosch GmbH, Stuttgart, Germany

[21] Appl. No.: 09/005,924

[22] Filed: Jan. 12, 1998

[30] Foreign Application Priority Data

Jan. 11, 1997 [DE] Germany ............... 197 00 734

[51] Int. Cl.⁷ .................................. H01L 21/306
[52] U.S. Cl. ................... 216/2; 216/13; 216/17; 216/39; 257/417; 257/419; 257/684; 257/727
[58] Field of Search .................. 216/2, 13, 17, 216/39; 257/417, 419, 684, 727

[56] References Cited

U.S. PATENT DOCUMENTS

| 5,323,051 | 6/1994 | Adams et al. | 257/417 |
| 5,421,956 | 6/1995 | Koga et al. | 216/2 |
| 5,528,214 | 6/1996 | Koga et al. | 338/4 |

FOREIGN PATENT DOCUMENTS 42 39 132  5/1993  Germany.

*Primary Examiner*—Samuel A. Acquah
*Attorney, Agent, or Firm*—Kenyon & Kenyon

[57] ABSTRACT

A wafer stack with sensor elements hermetically sealed in caverns and a method of fabricating the sensors permitting a reduction in the size of the sensors formed after cutting the wafer stack and also yielding considerable savings in chip area in the manufacture of the wafer stack. The wafer stack includes bonding strips arranged between the individual sensor elements. The wafer stack is diced to form individual sensors by sawing in the middle through the bonding strips.

12 Claims, 5 Drawing Sheets

WAFER STACK AND METHOD OF PRODUCING SENSORS

FIELD OF THE INVENTION

The present invention relates to a method for producing sensors and to a wafer stack.

BACKGROUND INFORMATION

A conventional wafer stack is described in U.S. Pat. No. 5,323,051, where frit glass strips arranged between a substrate wafer and a cap wafer hermetically seal an arrangement applied to the substrate wafer.

SUMMARY OF THE INVENTION

The method according to the present invention and the wafer stack according to the present invention require a reduced area. With an arrangement of a bonding medium and a suitable choice of groove width, more sensor elements can be accommodated per unit of wafer area. Accordingly, a chip area is reduced and smaller sensors are provided, which in turn take up less space in the respective application.

In a two-step sawing operation, the sensor elements can be tested for electrical functionality and/or imperviousness as long as the sensor elements are still combined on the wafer stack, and being already exposed to mechanical stresses due to the sawing operation. This makes it possible to sort out any sensors damaged in the sawing operation.

Before testing for electrical functionality and/or imperviousness, a healing step may be inserted; this leads to a higher chip yield and also to increased reliability in detecting damaged sensors.

If the sensor elements are arranged in pairs on the substrate wafer, in particular with laterally offset pairs, up to approximately 60% more sensors can be accommodated per wafer stack in contrast to a wafer stack with two strip arrangements of bonding medium between individual sensor elements without reducing the width of the screen printing structures required for the bonding strips. The method according to the present invention is also simple and inexpensive.

If headers are provided on the substrate wafer, then the bonding strips (e.g., strips of frit glass seal) can be arranged on the headers when applying the cap wafer to the substrate wafer. Accordingly, a flux barrier is advantageously provided for the bonding strips, which are better locally secured. In addition, a simpler testing procedure can be performed on the caverns for imperviousness (e.g., in optical leakage test methods in the infrared range), for which more gas is available in the caverns due to the increased cavern volume. Furthermore, a greater safety clearance of the sensor element from the cap wafer is achieved. The printed conductors contacting the sensor elements can also be arranged between the headers and the substrate wafer, which provides a flat header area for capping and ensures the imperviousness of the caverns.

A greater safety clearance can also be achieved with circumferential webs arranged on the cap wafer. For the headers on the substrate wafer as well as for the webs on the cap wafer, an increased safety clearance is advantageous and important, in particular due to a risk of adhesion of the sensor element to the cap wafer because of electrostatic attraction forces and adhesion forces. The webs also serve as a flux barrier for the bonding medium, in particular for frit glass seal as the bonding medium.

DETAILED DESCRIPTION

Figure 1A:
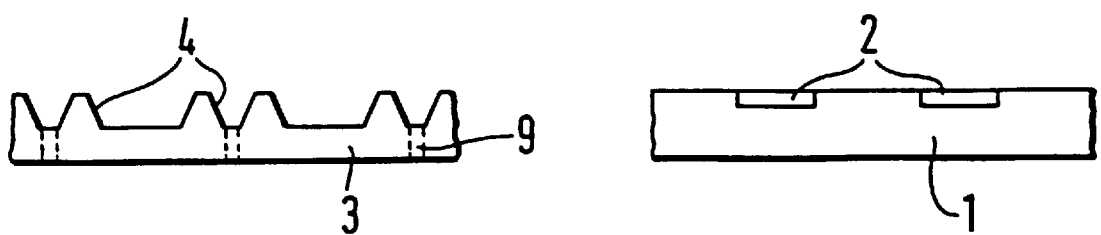
FIG. 1a shows a first step of a method for producing sensors according to the present invention.

FIGS. 1a–1h show a method for producing sensors. In particular, a substrate wafer 1 and a cap wafer 3 are provided in a cross-sectional view from the side. Sensor elements 2 are introduced into substrate wafer 1 (as illustrated in FIG. 1a) and provided with contacts (not shown). A cap wafer 3 is produced with webs 4 and contact holes 9. Webs 4 are visible only in cross section shown in FIG. 1a. Webs 4 extend along and across the cross section corresponding to the arrangement of sensor elements on substrate wafer 1, so that after a subsequent process step, they surround the individual sensor elements 2 along a closed line to form a hermetically sealed cavity. Contact holes 9 made into the cap wafer are arranged corresponding to the selected arrangement of contacts on the substrate wafer. After applying the cap wafer to the substrate wafer, the contact holes should guarantee accessibility to the contacts of the sensor elements through the cap wafer, so that the functionality of the sensor elements can be checked for example through measuring tips that can be inserted or to connect the sensors to electric circuits using bond wires applied subsequently to the contacts.

Figure 1B:
FIG. 1b shows a second step of the method for producing sensors.
Figure 1C:
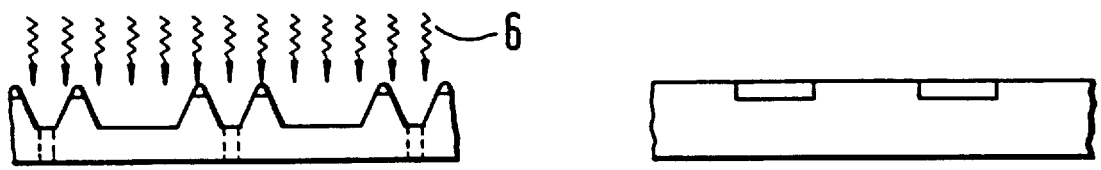
FIG. 1c shows a third step of the method for producing sensors.
Figure 1D:
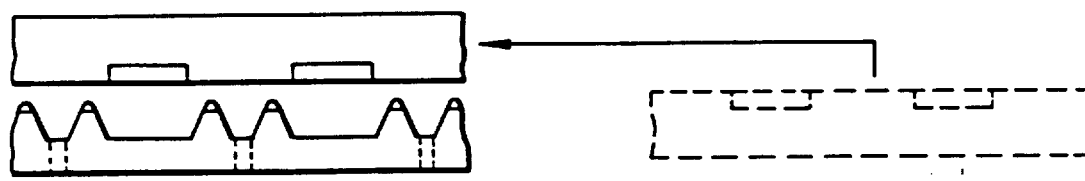
FIG. 1d shows a fourth step of the method for producing sensors.
Figure 1E:
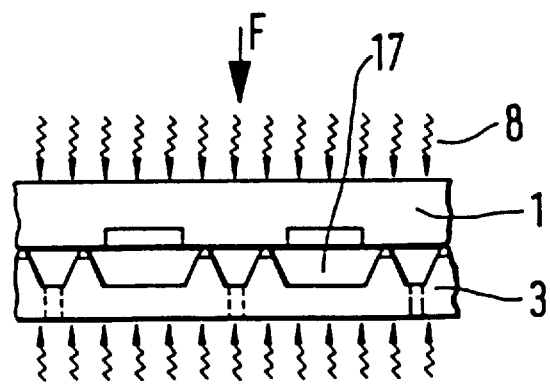
FIG. 1e shows a fifth step of the method for producing sensors.
Figure 1F:
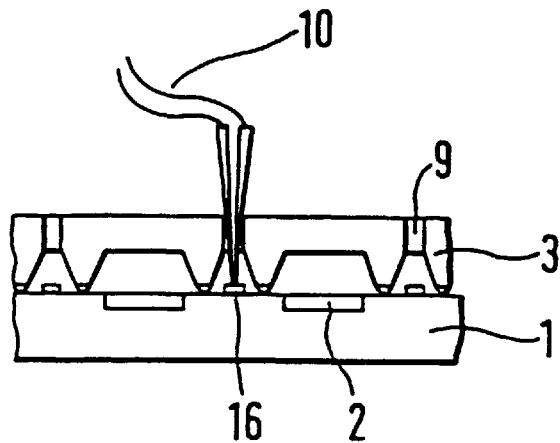
FIG. 1f shows a sixth step of the method for producing sensors.
Figure 1G:
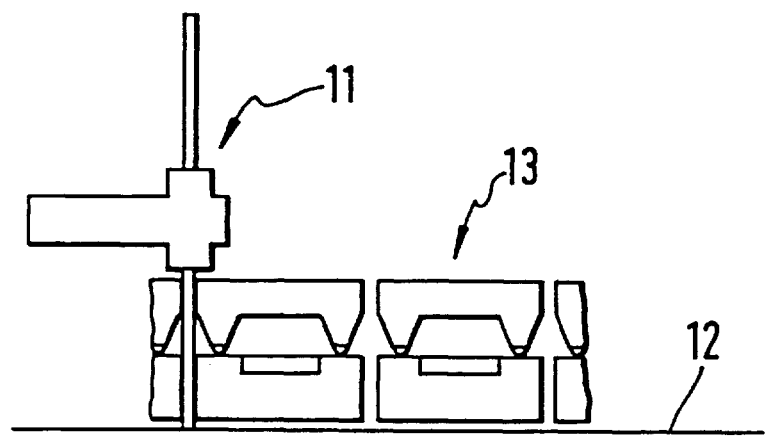
FIG. 1g shows a seventh step of the method for producing sensors.
Figure 1H:
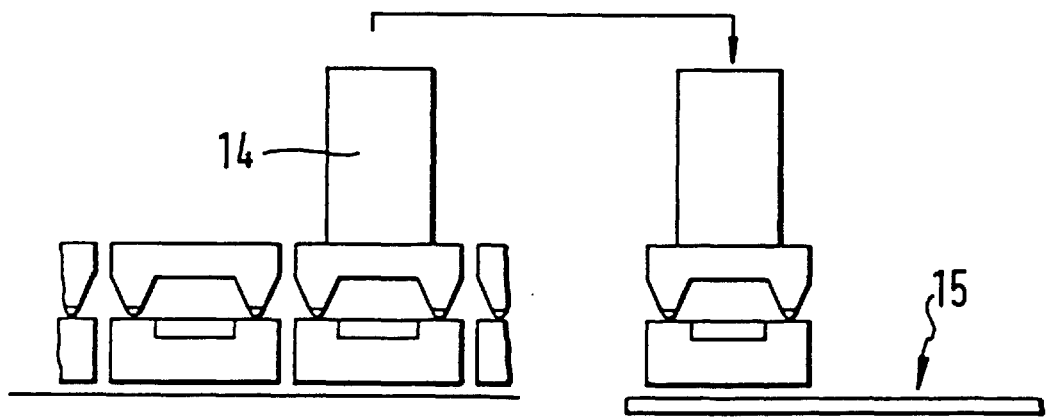
FIG. 1h shows an eighth step of the method for producing sensors.

FIG. 1b shows how bonding strips 5 are applied to webs 4 of cap wafer 3, e.g., by screen printing. These bonding strips includes a frit glass seal (e.g., glass solder). In a subsequent step, the bonding strips of frit glass seal (e.g., frit glass seal strips) are predried by heat supply 6 (see FIG. 1c). FIG. 1d shows how substrate wafer 1 and cap wafer 3 are aligned with respect to each other so that sensor elements 2 can be positioned between the frit glass seal strips. Cap wafer 3 and substrate wafer 1 are bonded over the frit glass strips by pressure and temperature 8, which can vary with time (i.e., bonding and sealing procedure is shown in FIG. 1e). Gases can be captured in the resulting caverns 17 under a defined pressure. After the bonding step described above, the sensor elements are tested for an electrical functionality, and a test for leakage of the caverns is performed, as illustrated in FIG. 1f. For this purpose, contacts 16, which electrically contact sensor elements 2, are applied to substrate wafer 1 before applying cap wafer 3 to substrate wafer 1. The sensor elements are tested for electrical functionality via these contacts 16 using a test device 10. This electric test can be used at the same time for testing the caverns for imperviousness because in the case of acceleration sensor elements, for example, the sensor signal changes as a function of the composition and pressure of the gas enclosed in caverns 17. However, the imperviousness may optionally also be tested separately, e.g., by optical leakage test methods, e.g., in the infrared range. Finally, as shown in FIG. 1g, the wafer stack is placed on a film 12 as a substrate and diced with a sawing device 11 to form individual sensors 13. Individual sensors 13 determined to be operational by the testing procedure are selected by a lifting device 14 (shown in FIG. 1h) and placed in a case or on a hybrid substrate 15.

Figure 2:
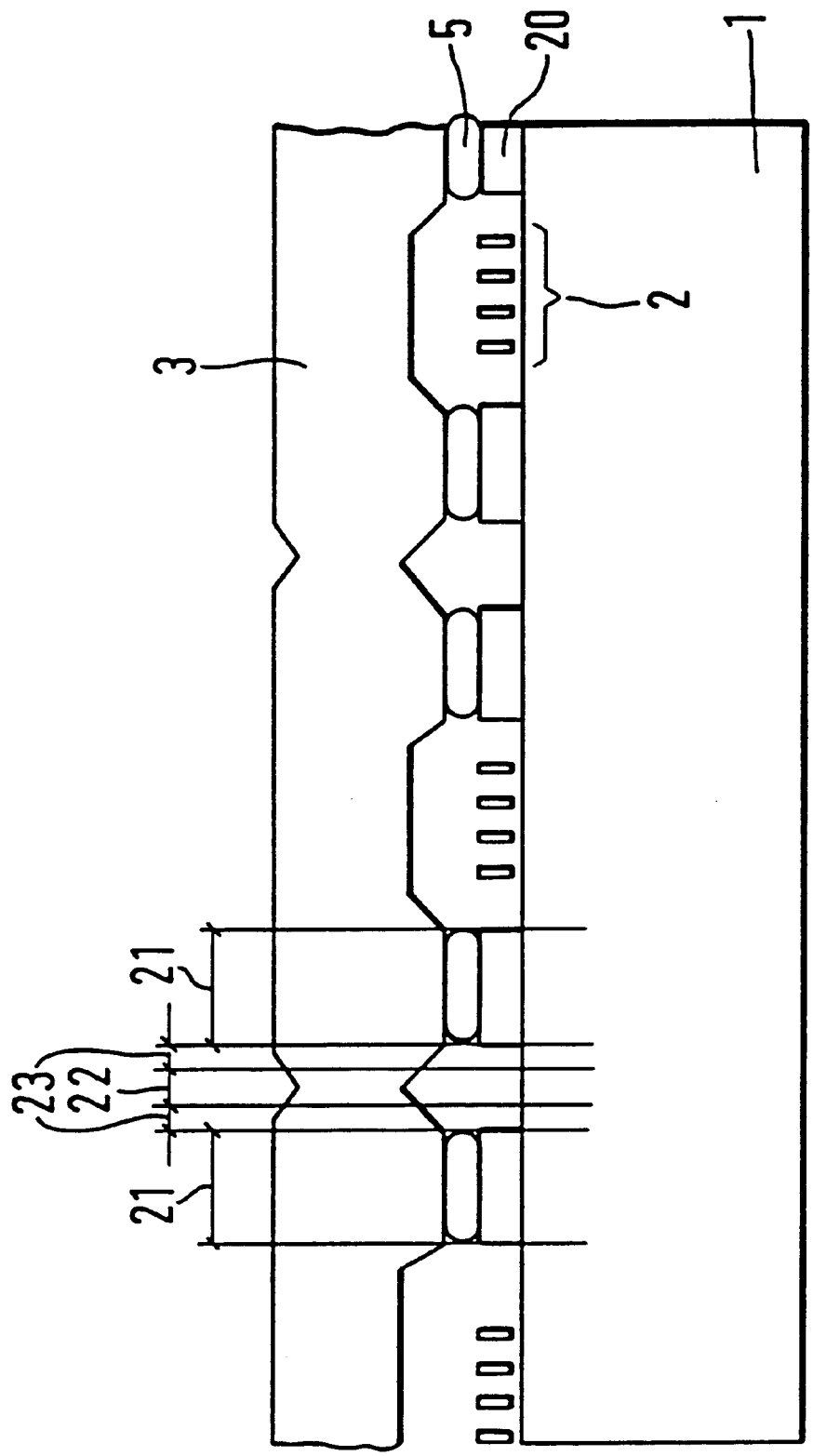
FIG. 2 shows a wafer stack according to the present invention with two bonding strips between adjacent sensor elements.

FIG. 2 shows a wafer stack wherein frit glass seal strips 5 with a width 21 are arranged on headers 20 of substrate wafer 1. Each sensor element 2 is surrounded by its own frit glass seal strip 5. Between frit glass seal strips 5 of adjacent sensor elements, there is an interspace with an extension composed of a groove width 22 and two times a distance 23. Dicing procedure is performed as described above by cutting through cap wafer 3 and substrate wafer 1 between adjacent frit glass seal strips 5. Due to the fabrication method, frit glass seal strips 5 have a width 21 of 500 $\mu$m, for example, corresponding to the header width as shown in FIG. 2. Sufficient space is provided between adjacent frit glass seal strips to permit cutting. Groove width 22 is, e.g., 100 $\mu$m, with a distance of 2×75 $\mu$m on both sides. However, a large amount of chip area may be needed. First, two frit glass seal strips are provided between adjacent sensor elements, and second, there is an extra clearance for cutting, characterized by groove width 22 and distance 23.

Figure 3:
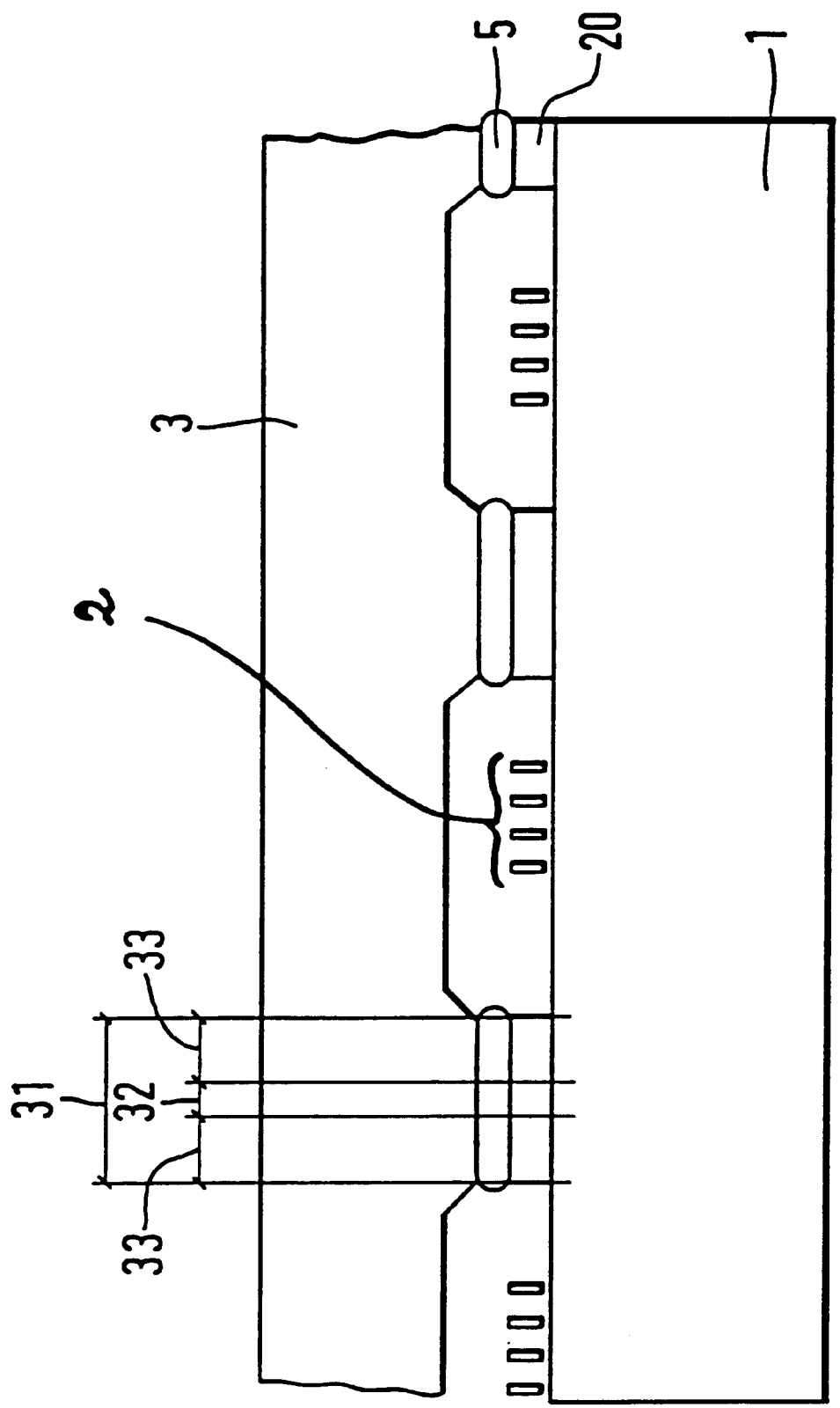
FIG. 3 shows a wafer stack according to the present invention with only one bonding strip between two directly adjacent sensor elements.

FIG. 3 shows another embodiment of the wafer stack according to the present invention. In contrast to the wafer stack shown in FIG. 2, only one frit glass seal strip is arranged between adjacent sensor elements. Accordingly, only one header is provided between adjacent sensor elements with a new header width 31, which is somewhat greater than the header width of the wafer stack illustrated in FIG. 2. For example, the new header width 31 is selected as 550 $\mu$m; the new header width 31 is composed of two header widths 33 and a new groove width 32, which is somewhat greater than groove width 22 of FIG. 2. The somewhat larger width is provided because a wider saw blade is necessary when cutting through glass, because the narrow saw blades that are used for silicon are not suitable because they become clogged with glass.

To reduce the area required for the frit glass seal strips and the grooves that are provided in comparison with the arrangement illustrated in FIG. 2, only one frit glass seal strip is provided between adjacent sensor elements in the wafer stack according to the present invention as shown in FIG. 3. Using a two-step sawing process, testability of the wafer stack described above with respect to FIG. 1 can be achieved by first cutting through only the cap wafer and the frit glass seal strip at predetermined locations, then testing the individual sensor elements for electrical functionality and testing the caverns for imperviousness and then dicing the sensor elements to form individual sensors with a second cutting step. The cutting procedure is performed under water. Hairline cracks can develop and fill up with water. Such damage in the frit glass seal because of the first cutting step can be healed by a healing-tempering step before testing. The thickness and grain of the saw blade in the first cutting step must be selected so that the frit glass seal and the cap wafer can be cut. The saw blade used in the second step may be either the same width or narrower. Thus, a lateral space requirement of approximately 275 $\mu$m per chip edge is provided for the frit glass seal strip between two adjacent sensor elements in the embodiment shown in FIG. 3.

The healing-tempering step takes place between temperatures of, e.g., 300° C. and 400° C. The precise temperature depends on the frit glass seal used. In this healing-tempering step, water comes out of the capillaries, and small cracks in the frit glass seal that do not represent a leak for the adjacent caverns heal. However, if a crack represents a hidden leak, this leak will be detected after the water escapes. The leak can also be detected in the testing process either by testing the electrical functionality of the sensor elements or by other leakage testing methods, e.g., optical methods in the infrared range or gas detection outside the caverns.

As an alternative to a screen printing process for applying the frit glass seal strip, stencil printing or another full-area coating method may also be used. Unstructured cap wafers, i.e., without webs 4, can also be used in this method. Instead of frit glass seal, other materials that can bind two wafers together with a gas-tight seal such as, e.g., adhesives, thermoplastics, other plastics or solders. It is also possible to use a cap wafer made of glass that is anodically bonded to the headers of the substrate wafer, because printed conductors that contacts the sensor elements can be arranged so these conductors extend beneath the headers, so that the flat surfaces of the headers can be polished electrochemically before anodic bonding. In principle, the method according to the present invention is not limited to sensor elements introduced but instead any type of "arrangement" that is to be protected from mechanical and/or thermal influences or is to be surrounded by a defined gas environment can be hermetically sealed by this method.

Figure 4A:
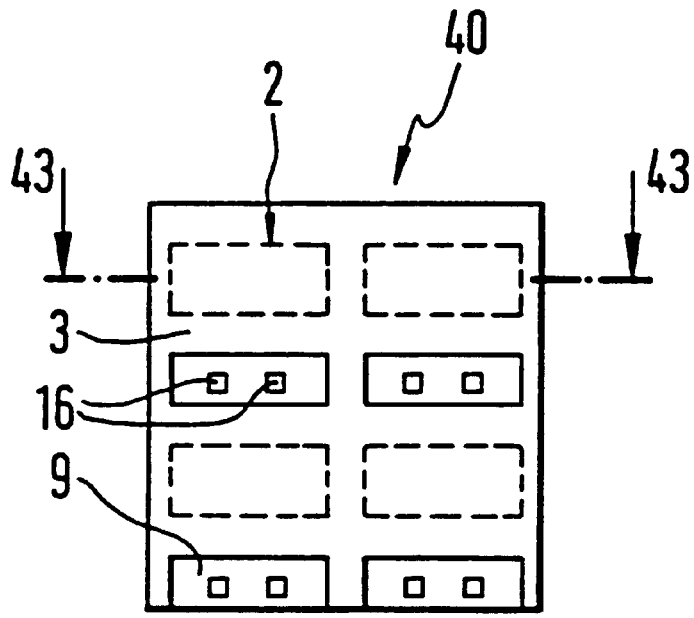
FIG. 4a shows a top view of a first arrangement of sensor elements in a wafer stack according to the present invention.
Figure 4B:
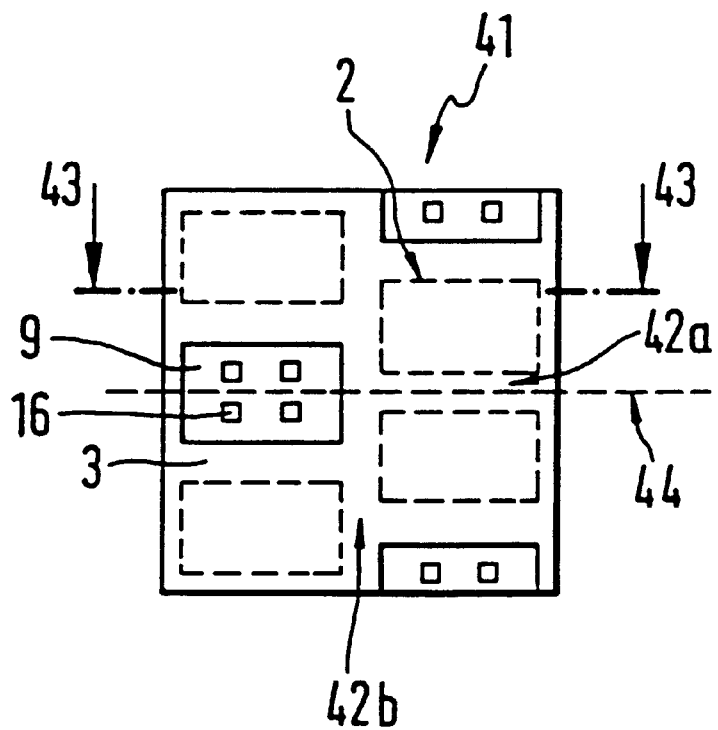
FIG. 4b shows a top view of a second arrangement of the sensor elements in the wafer stack according to the present invention.

FIGS. 4a and 4b show top views of the wafer stack according to the present invention. FIG. 4a shows a "normal" arrangement 40 of sensor elements 2 in the wafer stack. Sensor elements 2 are illustrated with dashed lines because they are concealed in the top view by cap wafer 3. The substrate wafer can be seen through contact holes 9. Contacts 16 are provided for each sensor element. Line 43 represents the cross section shown in FIG. 3. FIG. 4b shows a "mirror image" arrangement 41 of sensor elements 2 in the wafer stack. In contrast to the normal arrangement 40, the individual sensor elements in the reflected image 41 are arranged so they are laterally offset. Such arrangement reduces the required number of contact holes 9, because two sensor elements share one contact hole. The laterally offset arrangement also increases the mechanical stability of the wafer stack as compared to an arrangement where two sensor elements share one contact hole, but the contact holes and sensor elements are each arranged exactly along a line (not shown in FIGS. 4a and 4b).

A cutting line 44 in the mirror-image arrangement shown in FIG. 4b, for example, runs horizontally through the center of contact hole 9, which is shown completely, and continues from to the right in the figure along a contact-free area 42a filled with frit glass seal between two adjacent sensor elements. Another cutting line runs perpendicular to cutting line 44 through the center of contact-free area 42b.

The arrangements shown in FIGS. 4a and 4b are only a detail of a wafer stack with a plurality of sensor elements introduced into it. Thus, with two of the three contact holes 9 shown in FIG. 4b, only half of these contact holes are shown. With the normal arrangement 40 shown in FIG. 4a, the frit glass seal strip arrangement according to the present invention can be used on two chip edges per sensor element. However, with mirror-image arrangement 41 illustrated in FIG. 4b, the frit glass seal strip arrangement can be used on three chip edges per sensor element. The demarcation of a sensor element from the respective contact hole is also implemented with a frit glass seal strip having a width corresponding to header width 21 as shown in FIG. 2. With a mirror-image arrangement 41 illustrated in FIG. 4b, this yields a chip area saving of 60% per wafer stack as compared to an arrangement 40, when a frit glass strip arrangement shown in FIG. 2 is used. This number is obtained when a length of 2.3 mm per sensor element including the respective frit glass seal strips is assumed along cross-section 43 in FIG. 4a, and perpendicular to this a length demand of 2.8 mm per sensor element and the respective contact hole is assumed. In this arrangement, this yields an area demand of 6.44 mm$^2$. On the other hand, a mirror-image arrangement shown in FIG. 4b with the arrangement of frit glass strips according to this invention yields a reduced area demand of 3.92 mm$^2$ per sensor ((2.3 mm−2×0.35 mm)×(2.8 mm−0.35 mm)=3.92 mm$^2$).

What is claimed is:

1. A method for producing sensors, comprising the steps of:
    (a) situating at least two sensor elements on a substrate wafer, the sensor elements including electric contacts;
    (b) introducing contact holes into a cap wafer;
    (c) applying a bonding medium on the cap wafer, the bonding medium including bonding strips;
    (d) applying the cap wafer to the substrate wafer, wherein only one of the bonding strips is positioned between two elements of the at least two sensor elements and is positioned around the contact holes;
    (e) hermetically sealing caverns using the bonding medium, the at least two sensor elements being arranged in the caverns;
    (f) after performing steps (c) through (e), sawing through the cap wafer and the bonding strips at predetermined locations, the predetermined locations subsequently forming lateral external surfaces of the sensors;
    (g) after step (f), testing the caverns to determine if the caverns are impervious, the caverns being tested via at least one of the contact holes; and
    (h) after step (g), sawing through the substrate wafer to completely separate the sensors.

2. The method according to claim 1, further comprising the step of:
    (i) before step (g), heating the cap wafer and the substrate wafer.

3. The method according to claim 1, wherein the at least two sensor elements are arranged in predetermined pairs on the substrate wafer, each of the predetermined pairs having one hole, the one hole providing an access to the electric contacts of the sensor elements of each of the predetermined pairs.

4. The method according to claim 3, wherein the predetermined pairs include at least two pairs, one of the at least two pairs being laterally offset relative to another one of the at least two pairs.

5. The method according to claim 1, further comprising the step of:
    (j) providing headers on the substrate wafer, the bonding strips being arranged on the headers for providing the cap wafer on the substrate wafer.

6. An undiced wafer stack, comprising:
    a substrate wafer;
    at least two sensor elements applied to the substrate wafer;
    a cap wafer applied to the substrate wafer, the cap wafer bonding to the substrate wafer through a bonding medium, the bonding medium including bonding strips, the bonding strips hermetically sealing caverns, the caverns containing the at least two sensor elements; and
    at least one contact arranged outside each of the caverns for electrically contacting a respective element of the at least two sensor elements,
    wherein the cap wafer has at least one contact hole at an external portion of the caverns for providing an access to the at least one contact,
    wherein only one of the bonding strips separates one of the caverns from another one of the caverns at predetermined areas between two elements of the at least two sensor elements.

7. The undiced wafer stack according to claim 6, wherein the at least two sensor elements are arranged in predetermined pairs, and wherein one of the contact holes provides the access to a respective contact of each sensor element of the predetermined pairs for each pair of the at least two sensor elements.

8. The undiced wafer stack according to claim 6, wherein the predetermined pairs include at least two pairs, one of the at least two pairs being laterally offset relative to another one of the at least two pairs.

9. The undiced wafer stack according to claim 6, wherein the cap wafer includes webs.

10. The undiced wafer stack according to claim 6, wherein the substrate wafer includes headers.

11. The undiced wafer stack according to claim 9, wherein the webs have a one piece structure with the cap wafer.

12. The undiced wafer stack according to claim 10, wherein the headers and the at least two sensor elements are produced from a polysilicon layer applied to the substrate wafer.

* * * * *